United States Patent [19]
Glorioso

[11] Patent Number: 6,087,959
[45] Date of Patent: Jul. 11, 2000

[54] OPTICALLY COUPLED GAS METER

[75] Inventor: Charles A. Glorioso, Castro Valley, Calif.

[73] Assignee: Diablo Research Company, LLC, Sunnyvale, Calif.

[21] Appl. No.: 09/084,551

[22] Filed: May 26, 1998

[51] Int. Cl.[7] .................................................. G08B 23/00
[52] U.S. Cl. ........................... 340/870.02; 250/231.14; 250/231.11; 340/870.28; 377/21; 73/861.77
[58] Field of Search .................. 340/870.02, 870.03, 340/870.28, 870.29, 870.27, 870.22, 870.18; 250/231.14, 231.13, 231.16, 227.21, 231.11, 231.15; 377/21; 73/861.77, 861.78

[56] References Cited

U.S. PATENT DOCUMENTS

| | | | |
|---|---|---|---|
| 2,182,717 | 12/1939 | Chance | 318/640 |
| 3,351,767 | 11/1967 | Suiter | 250/230 |
| 4,061,901 | 12/1977 | Saunders | 377/21 |
| 4,124,839 | 11/1978 | Cohen | 340/870.02 |
| 4,489,615 | 12/1984 | Ward | 377/21 |
| 4,609,817 | 9/1986 | Mumzhiu | 250/231.11 |
| 5,004,913 | 4/1991 | Kleinerman | 250/277.21 |
| 5,259,251 | 11/1993 | Brinster | 377/21 |

*Primary Examiner*—Michael Horabik
*Assistant Examiner*—Albert K. Wong
*Attorney, Agent, or Firm*—David R. Gildea

[57] ABSTRACT

A gas meter using optical communication. The meter includes a shaft that is rotated by a flow of gas, a first sensor for sensing a first rotational angle of the shaft, a second sensor for sensing a second rotational angle of the shaft, a first light source operated by the first sensor for issuing a first light signal, and a second light source operated by the second sensor for issuing a second light signal. One or more fiber optic cables carries the light signals to an external meter interface having an optical receiver. A rotation of the shaft is recognizable by the external receiver when first one then the other of the light signals is detected.

22 Claims, 4 Drawing Sheets

OPTICALLY COUPLED GAS METER

BACKGROUND OF THE INVENTION

1. Field of the Invention

The invention relates generally to gas meters and more particularly to a gas meter having an optical coupling to an external meter interface.

2. Description of the Prior Art

Within recent years a considerable amount of interest has been generated for remote meter reading for gas meters. In one technique, meter reading signals are transmitted from the gas meter through wires to a communication network and then through the network to the gas provider or utility company. However, a problem with this technique is that there is a possibility that electricity from a lightening strike could be carried by the wires into the gas meter and, if a gas leak was present, cause a spark that would result in an explosion. In order to solve this problem, wireless communication is sometimes used. However, the difficulty of meeting government signal regulations in some locations and cost of the wireless equipment sometimes make wireless systems uneconomical. Several workers have used or proposed using optic communication through fiber optic cables in order to avoid the possibility of a lightening induced explosion without the difficulties and cost of wireless communication. However, the known remote fiber optic gas meter reading systems are relatively complex and expensive or have the possibility that a backward flow of gas or a flash light shined into the gas meter can cause a false reading.

SUMMARY OF THE INVENTION

It is therefore an object of the present invention to provide a simple and inexpensive method and apparatus for remote meter reading using optical communication where a momentary backward rotation of the meter or an incidental light shined into the meter does not cause a false reading.

Briefly, in a preferred embodiment, a meter of the present invention is a gas meter including a shaft that is rotated by a flow of gas. The gas meter includes a first sensor for sensing a first rotational angle of the shaft; a second sensor for sensing a second rotational angle of the shaft; a first light source operated by the first sensor for issuing a first light signal; and a second light source operated by the second sensor for issuing a second light signal. One or more fiber optic cables carry the light signals to an external meter interface having an optical receiver. A rotation of the shaft is recognizable by an external meter interface when first one then the other of the light signals is detected. The alternating light signals may also be used to distinguish the rotation of the shaft from an incidental light where both light signals would occur together. A momentary backward flow of gas causing a backward rotation of the shaft is recognizable when the same light signal is received two times consecutively and is not counted as a rotation for measuring the flow of gas from a gas provider to a user. In one embodiment, the sensors are magnetic switches and a magnet mounted on the shaft activates each switch when the shaft passes the associated angle. In another embodiment, the sensors are push button switches activated by a cam on the shaft. Each switch connects a respective one of the light sources to a battery power source causing the light source to send the light signals into the fiber optic cables. The light signals are short pulses in order to maximize battery life and to enable an external meter interface to distinguish the light signal from an incidental light. In another embodiment, the sensors are piezoelectric devices mounted on respective leaf springs. A cam on the shaft causes each leaf spring to bend when the shaft passes the associated angle. The bending of the leaf springs strain the piezoelectric devices causing respective electrical signals which are used to power the light sources.

In one embodiment, two fiber optic cables are used so that each cable carries the light signal from a respective one of the light sources. In another embodiment, one of the light signals is passed through a vertically polarizing lens and the other light signal is passed through a horizontally polarized lens. The vertically and horizontally polarized light signals are then carried by a single fiber optic cable. In another embodiment the light sources issue light signals at different wavelengths that are carried by a single fiber optic cable. In another embodiment only a single sensor and a single light source are used for sensing that the shaft is passing an angle and issuing a light and a ratchet is used for preventing a backward rotation of the shaft.

An advantage of the present invention is that an inexpensive and simple method and apparatus provide a remote meter reading without the regulations and expense of wireless communications or the possibility of a spark from electrical wires, where a momentary backward rotation of the meter or an incidental light does not cause a false reading.

These and other objects and advantages of the present invention will no doubt become obvious to those of ordinary skill in the art after having read the following detailed description of the preferred embodiments which are illustrated in the various figures.

DETAILED DESCRIPTION OF THE PREFERRED EMBODIMENTS

Figure 1B:
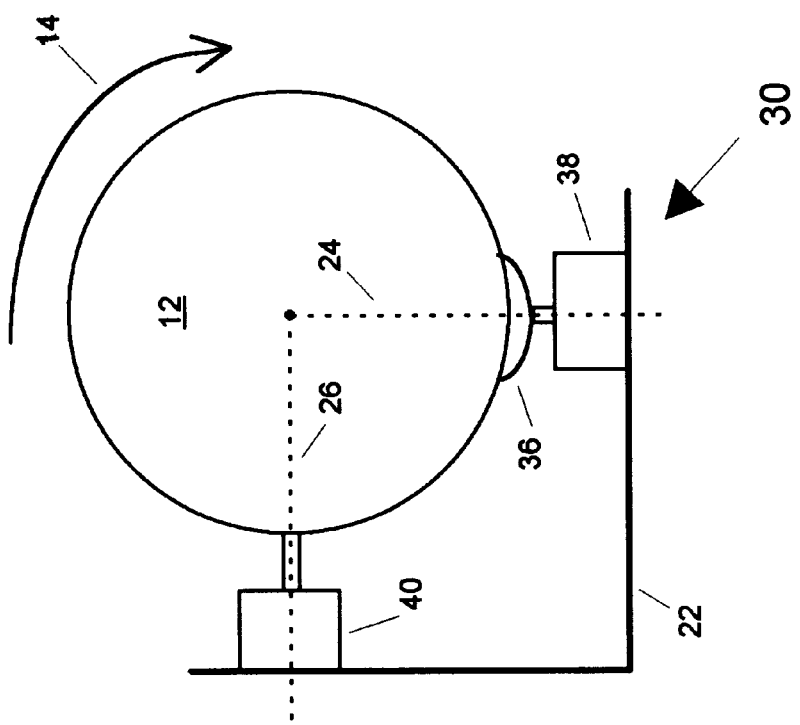
FIGS. 1a and 1b are drawings of sensors using a magnet and a cam, respectively, for sensing rotation of a shaft for a gas meter of the present invention.
Figure 1A:
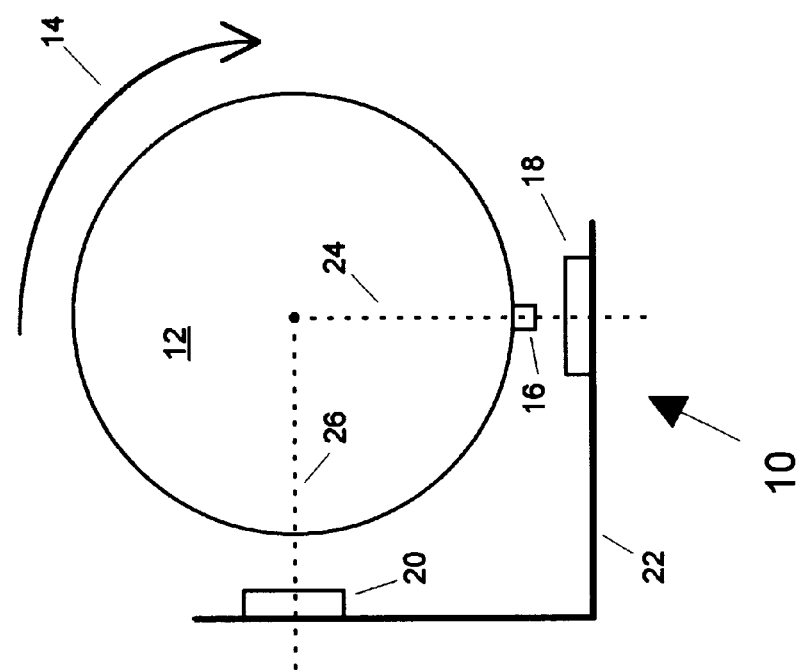

FIG. 1a is a drawing of an embodiment of a gas meter of the present invention referred to by the reference number 10. The gas meter 10 includes a rotating shaft 12 that is driven by a flow of gas into a residential or commercial establishment to rotate in a direction 14. A magnet 16 attaches to the shaft 12. Magnetically operated switches 18 and 20 are fixed to a rigid housing 22 at shaft angles 24 and 26, respectively, where the angular difference between the angle 24 and the angle 26 is in a range of about ninety to one-hundred eighty degrees. Switches known as reed switches suitable for use as the magnet switches 18 and 20 are commercially from many vendors. In operation, the magnetic switch 18 is closed (makes an electrical connection) by a magnetic field emitted by the magnet 16 when the rotation of the shaft 12 positions the magnet 16 at the angle 24 and otherwise is open (does not make an electrical connection). Similarly, the magnetic switch 20 is closed by the magnetic field when the rotation of the shaft 12 positions the magnet 16 at the angle 26 and otherwise is open. FIG. 1a shows the magnet 16 at the angle 24 where the magnetic switch 18 is closed and the magnetic switch 20 is open. Thus, each rotation of the shaft 12 is indicated by the alternating sequential operation of the switches 18 and 20.

FIG. 1b is a drawing of an embodiment of a gas meter of the present invention referred to by the reference number 30. The gas meter 30 includes the rotating shaft 12 that is driven by a flow of gas to rotate in the direction 14. A cam 36 attaches or is integral to the shaft 12. Push button switches 38 and 40 are fixed to the rigid housing 22 at the shaft angles 24 and 26, respectively. In operation, the push button switch 38 is closed when the rotation of the shaft 12 positions the cam 36 at the angle 24 and otherwise is open. Similarly, the push button switch 40 is closed when the rotation of the shaft 12 positions the cam 36 at the angle 26 and otherwise is open. FIG. 1b shows the cam 36 at the angle 24 where the push button switch 38 is closed and the push button switch 40 is open. Thus, each rotation of the shaft 12 is indicated by the alternating sequential operation of the switches 38 and 40.

Figure 2A:
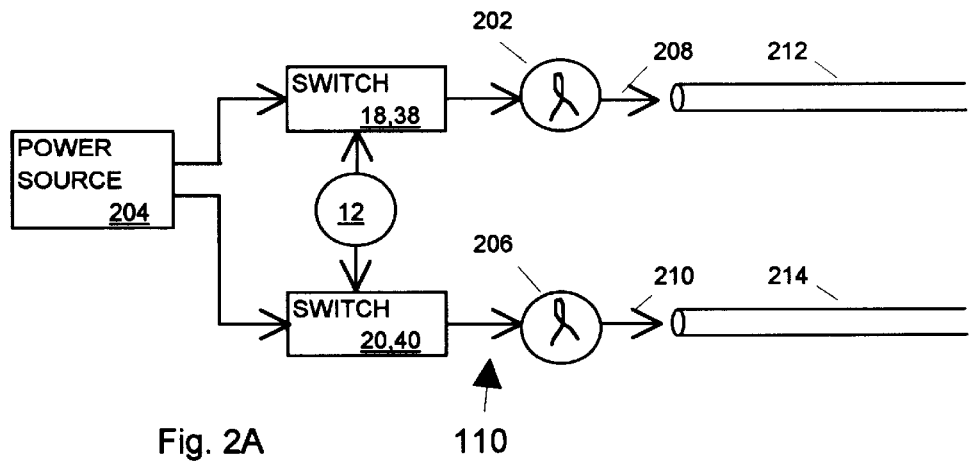
FIGS. 2a, 2b, and 2c are block diagrams for an optical coupling from the gas meter of FIGS. 1a and 1b to an external meter interface.
Figure 2B:
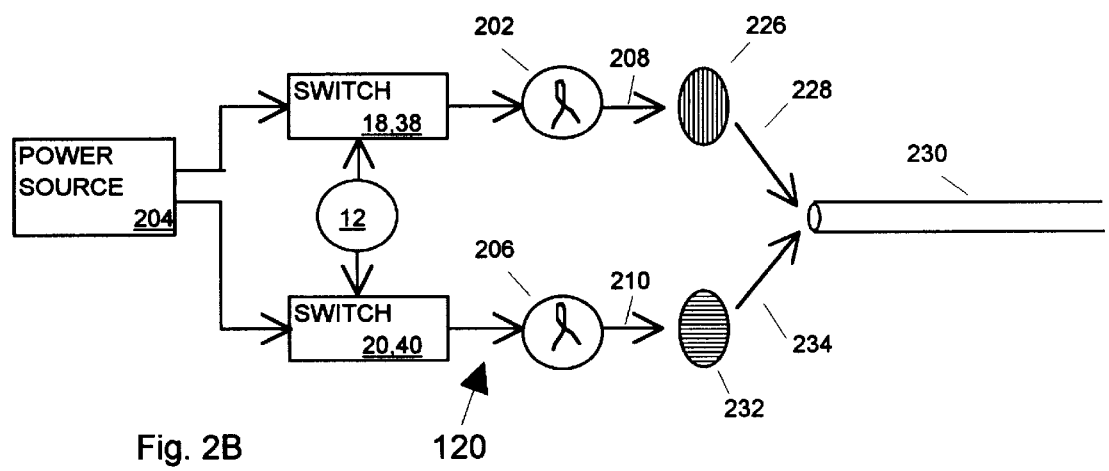
Figure 2C:
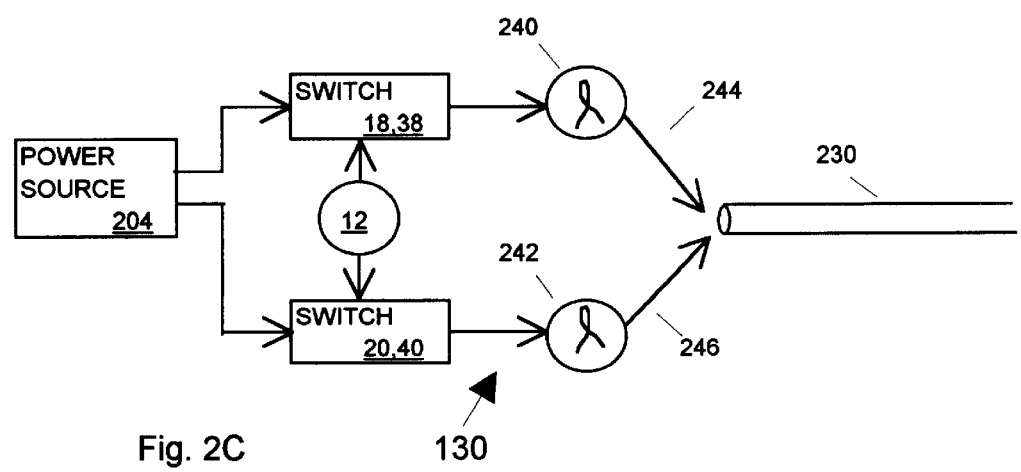

FIGS. 2a, 2b, and 2c are block diagrams of several embodiments of a gas meter of the present invention referred to by the reference numbers 110, 120, and 130, respectively. The gas meters 110, 120, and 130 include the rotating shaft 12 with the magnet 16 (FIG. 1a) or the cam 36 (FIG. 1b), the switch 18 or 38, and the switch 38 or 40 as described above, or the like. Referring to the gas meters 110 and 120, the switch 18 or 38 connects a light source 202 to a power supply 204. Similarly, the switch 20 or 40 connects a light source 206 to the power supply 204. When the switch 18 or 38 is closed, the light source 202 uses energy from the power supply 204 for transmitting a light signal 208. Similarly, when the switch 20 or 40 is closed, the light source 206 uses energy from the power supply 204 for transmitting a light signal 210. Light emitting diodes (LED)s suitable for use as the light sources 202 and 206 are commercially available from several vendors. Referring to the gas meter 110, the light signal 208 is issued into an optical cable 212 and the light signal 210 is issued into an optical cable 214. One or more lenses may be used for concentrating the light signals 208 and 210 on the end of the optical cables 212 and 214, respectively. The light signals 208 and 210 are carried by the respective optical cables 212 and 214 to an external meter interface having an optical receiver where an alternating sequential detection of the light signals 208 and 210 can be used for indicating the rotation of the shaft 12.

Referring to the gas meter 120, when the switch 18 or 38 is closed, the light source 202 uses energy from the power supply 204 for transmitting the light signal 208 to a vertically polarized filter 226. Using an optical Y connection and/or one or more lenses or mirrors, the filter 226 passes a vertically polarized light signal 228 into an optical cable 230. Similarly, when the switch 20 or 40 is closed, the light source 206 uses energy from the power supply 204 for transmitting the light signal 210 to a horizontally polarized filter 232. Again using the optical Y connection and/or one or more lenses or mirrors, the filter 232 passes a horizontally polarized light signal 234 into the optical cable 230. The vertically and horizontally polarized light signals 228 and 234 are carried by the optical cable 230 to an external optical receiver where the alternating sequential detection of the vertical and horizontal light signals 228 and 234 can be used for indicating the rotation of the shaft 12.

Referring to the gas meter 130, the switches 18 or 38 connect a light source 240 having a first characteristic wavelength to the power supply 204. Similarly, the switch 20 or 40 connects a light source 242 having a second characteristic wavelength to the power supply 204. Light emitting diodes (LED)s suitable for use as the light sources 240 and 242 having distinguishable wavelengths such as red and green are commercially available from several vendors. The light source 240 uses energy from the power supply 204 for transmitting a light signal 244 having the first wavelength into the optical cable 230. Similarly, when the switch 20 or 40 is closed, the light source 242 uses energy from the power supply 204 for transmitting a light signal 246 having the second wavelength into the optical cable 230. Preferably, the light sources 240 and 242 are positioned closely together on a single substrate for beaming the light signals 244 and 246, respectively, directly into the optical cable 230. Alternatively, the light signals 244 and 246 may be separately beamed into the cable 230 using one or more lenses or mirrors. The first wavelength light signal 244 and the second wavelength light signal 246 are carried by the optical cable 230 to an external optical receiver where the alternating sequential detection of the two wavelengths for the light signals 244 and 246 can be used for indicating the rotation of the shaft 12.

The light sources 202 and 206 or 240 and 242 and the power source 204 connect to a common line in order to complete electrical circuits. The power source 204 includes a low voltage battery and a trickle charge circuit for connecting the battery to the switches 18 and 38 or 20 and 40 in order to prevent the light sources 202 and 206 or 240 and 242, respectively, from draining the battery when the shaft 12 is stopped at one of the angles 24 or 26. One such trickle charge circuit uses a resistor in series from the battery to one end of a capacitor and to the switches 18 and 38 or 20 and 40. The other end of the capacitor is connected to the common line. The values of the resistor and the capacitor are selected so that the capacitor discharges enough energy to cause a short pulse of light for the light signals 208, 210, 244, and 246 when one of the switches 18, 38, 20, or 40 closes and then recharges during the time for the shaft 12 to travel in the direction 14 from the angle 24 to the angle 26 and from the angle 26 to the angle 24. The light signals 208, 210, 244, and 246 are distinguishable by an external optical receiver from an incidental light such as a flash light beam by the shortness of the pulses. Alternatively, separate trickle charge circuits may be used in the gas meter 10 (FIG. 1a) to connect the battery to the switch 18 and the switch 38 or in the gas meter 30 (FIG. 1b) to the switch 20 and the switch 40.

Figure 3:
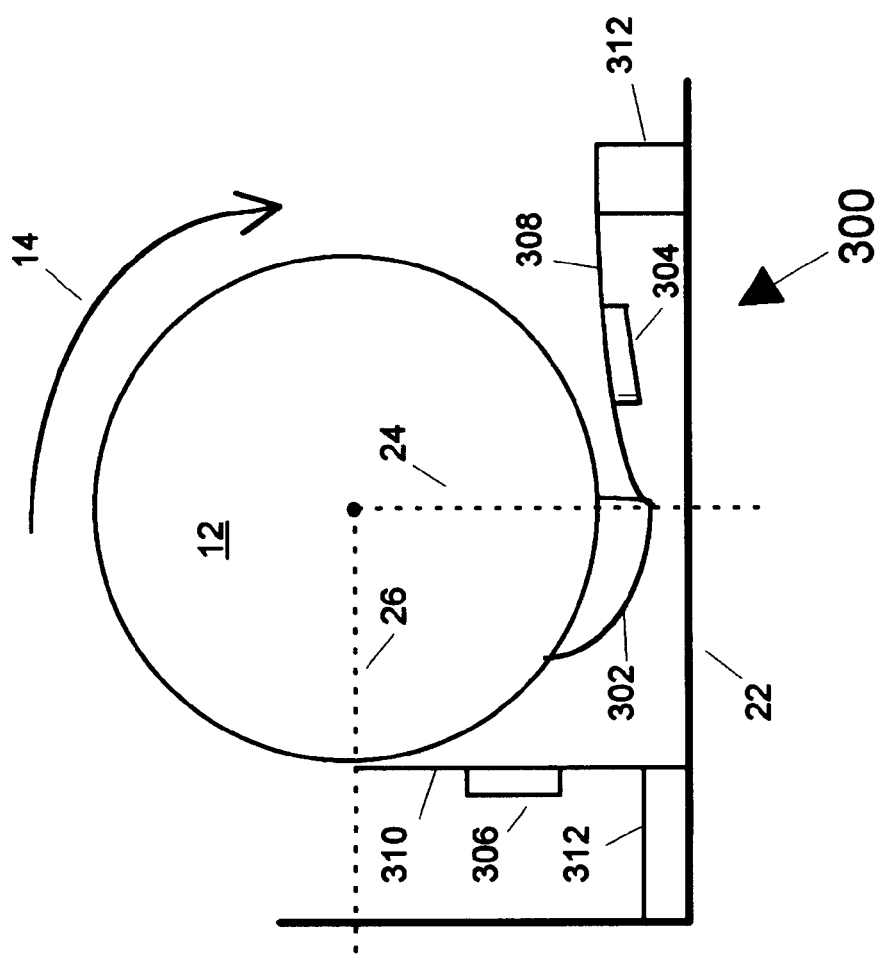
FIG. 3 is a drawing of a sensor using a piezoelectric device for sensing rotation of a shaft in a gas meter of the present invention.

FIG. 3 is a drawing of an embodiment of the present invention of a gas meter referred to by the reference number 300. The gas meter 300 includes the rotating shaft 12 that is driven by a flow of gas to rotate in the direction 14. A cam 302 attaches or is integral to the shaft 12. Piezoelectric devices 304 and 306 attach to respective leaf springs 308 and 310. At one end, the leaf springs 308 and 310 are in sliding contact with the rotating shaft 12 at the angles 24 and 26, respectively. At the other end the leaf springs 308 and 310 are anchored to the housing 22 through standoffs 312. In operation, a soft incline at the leading edge of the cam 302 causing a slow bending of the leaf springs 308 and 310 as the shaft 12 approaches the angles 24 and 26, respectively. When the angles 24 and 26 are reached a sharp decline at the trailing edge of the cam 302 causes the leaf springs 308 and 310 to spring back rapidly. The rapid change in the bend of the leaf spring 308 results in a sharp release of strain on the piezoelectric device 304 causing a momentary electrical signal to be emitted. Similarly, the rapid bending in the leaf spring 310 results in a sharp release of strain on the piezoelectric device 306 causing another momentary electrical signal to be emitted. Thus, each rotation of the shaft 12 is indicated by the alternating sequential electrical signals from the piezoelectric devices 304 and 306. The electrical signals are passed to the light sources 202 and 206 (FIGS. 2a–b) or 240 and 242 (FIG. 2c) for generating the light signals 208 and 210 (FIGS. 2a–b) or 244 and 246 (FIG. 2c), respectively, thereby eliminating a need for the power source 204.

Figure 4:
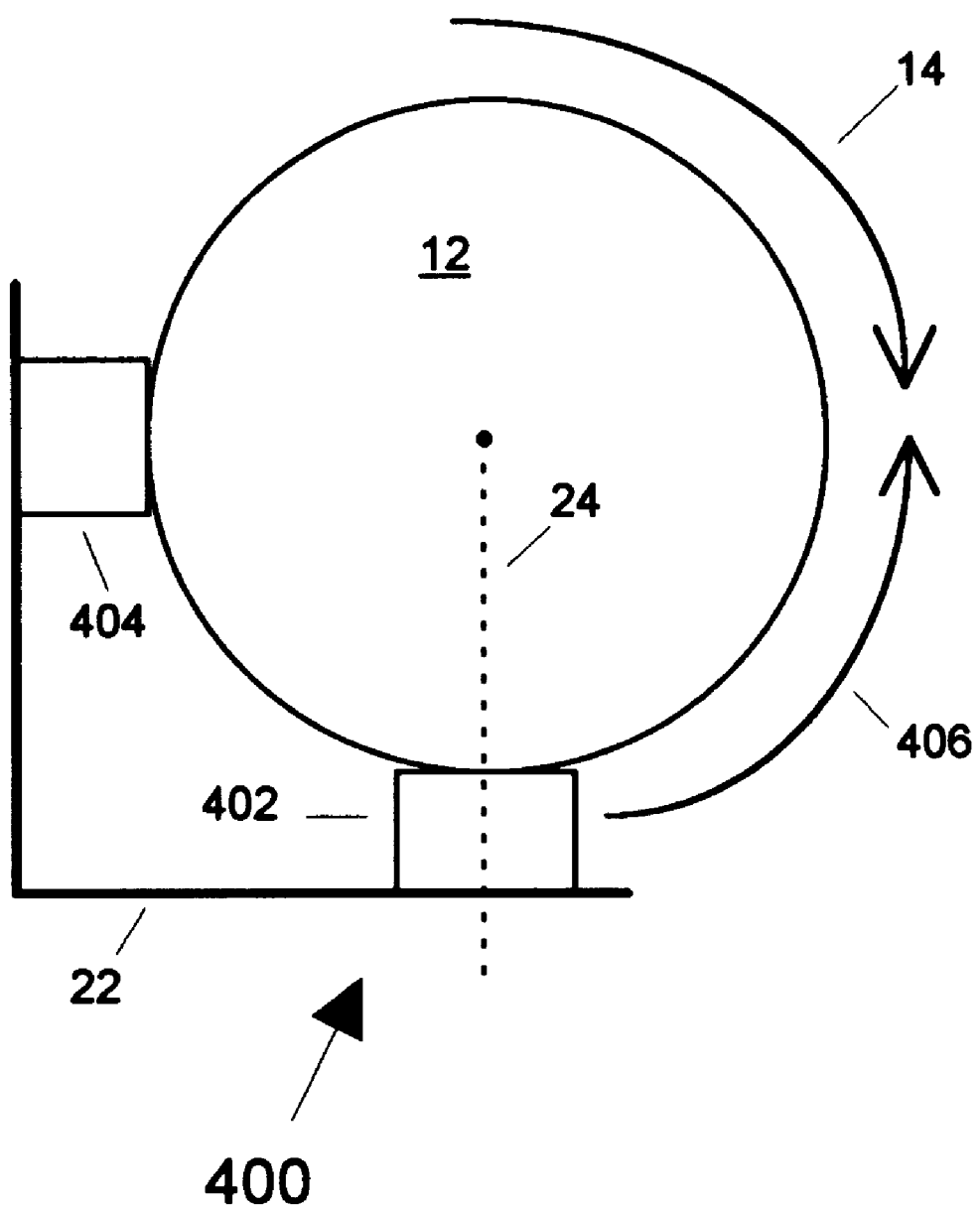
FIG. 4 is a drawing of a ratchet and a sensor for sensing rotation of a shaft for a gas meter of the present invention.

FIG. 4 is a drawing of a variation of the present invention of a gas meter and referred to by the reference number 400. The gas meter 400 includes the rotating shaft 12 that is driven by a flow of gas to rotate in the direction 14. A sensor device 402, such as the magnet 16 and the magnetic switch 18 illustrated in FIG. 1a; or the cam 36 and the push-button switch 38 illustrated in FIG. 1b; or the cam 302, the leaf spring 308, and the piezoelectric device 304 illustrated in FIG. 3 and described in the accompanying detailed descriptions above, senses when the shaft 12 is at the angle 24. FIG. 4 shows the sensing device 402 at the angle 24 where a cycle of rotation of the shaft 12 is being sensed. A ratchet 404 includes an inclined tooth or cavity on the shaft 12 into which a pawl drops or is biased by a spring so that rotation in a backward direction 406 is prevented while the rotation in the direction 14 is not impeded. In the gas meter 400 only a single one of the sensor device 402 is required so that the second switch 20 or 40, the second leaf spring 310, the second piezoelectric device 306, the second light source 206 and 242, and/or the second cable 214 are not needed. In a further variation of the present invention, the cam 302 and the leaf spring 308 act as the ratchet 404.

Although the present invention has been described in terms of the presently preferred embodiments, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A meter reading system, comprising:

a rotating member having angles corresponding to readouts of the meter;

a first sensor for issuing a first indication when the rotating member is passing a first angle;

a second sensor for issuing a second indication when the rotating member is passing a second angle;

a first light source for issuing a first light signal in response to said first indication; and a second light source for issuing a second light signal in response to said second indication.

2. The system of claim 1, wherein:

the meter is a gas meter; and the rotating member is for rotation by a flow of gas.

3. The system of claim 1, further including:

a first fiber optic cable for carrying said first light signal; and a second fiber optic cable for carrying said second light signal.

4. The system of claim 1, wherein:

the first light source is for issuing said first light signal at a first wavelength; and the second light source is for issuing said second light signal at a second wavelength distinguishable from said first wavelength.

5. The system of claim 4, further including:

a single fiber optic cable coupled to the first and second light sources for carrying said first and said second light signals.

6. The system of claim 1 wherein:

the first light source includes a first polarizing light filter for polarizing said first light signal at a first polarity; and the second light source includes a second polarizing light filter for polarizing said second light signal at a second polarity distinguishable from said first polarity.

7. The system of claim 6, further including:

a single fiber optic cable coupled to the first and second polarizing light filters for carrying said first and said second polarized light signals.

8. The system of claim 1, wherein:

the first sensor includes a first switch mounted adjacent to the rotating member in relation to said first angle for sensing said first indication and responsively causing the first light source to be connected to a source of energy for issuing said first light signal; and the second sensor includes a second switch mounted adjacent to the rotating member in relation to said second angle for sensing said second indication and responsively causing the second light source to be connected to a source of energy for issuing said second light signal.

9. The system of claim 8, further including:

a magnet disposed on the rotating member for issuing a magnetic field to said first switch when the rotating member is at about said first angle and issuing said magnetic field to said second switch when the rotating member is at about said second angle; and wherein:

said first switch is for sensing said magnetic field at about said first angle for sensing said first indication; and said second switch is for sensing said magnetic field at about said second angle for sensing said second indication.

10. The system of claim 8, wherein:

the rotating member includes a cam;

said first switch is for sensing when said cam is at about said first angle; and said second switch is for sensing when said cam is at about said second angle.

11. The system of claim 1, wherein:

the first sensor includes a first piezoelectric device mounted for a first rapid strain when the rotating member is at about said first angle and issuing said first indication including a first electrical signal in response to said fir st rapid strain;

the first light source is for issuing said first light signal in response to said first electrical signal;

the second sensor includes a second piezoelectric device mounted for a second rapid strain when the rotating member is at about said second angle and issuing said second indication including a second electrical signal in response to a change in said second rapid strain; and the second light source is for issuing said second light signal in response to said second electrical signal.

12. A method for optically reading a meter, comprising steps of:

using a flow for rotating a rotating member;

generating a first indication when said rotating member is passing a first angle;

generating a second indication when said rotating member is passing a second angle;

issuing a first light signal from a first light source in response to said first indication; and issuing a second light signal from a second light source in response to said second indication.

13. The method of claim 12, wherein:

said flow is a gas flow.

14. The method of claim 12, further including steps of:

carrying said first light signal on a first fiber optic cable; and carrying said second light signal on a second fiber optic cable.

15. The method of claim 12, wherein:

said first light signal is at a first wavelength; and said second light signal is at a second wavelength distinguishable from said first wavelength.

16. The method of claim 15, further including a step of:

carrying said first and said second light signals in a single fiber optic cable.

17. The method of claim 12, further including steps of:

filtering said first light signal for passing a first polarity; and filtering said second light signal for passing a second polarity distinguishable from said first polarity.

18. The method of claim 17, further including a step of:

carrying said first and said second polarity light signals on a single fiber optic cable.

19. The method of claim 12, wherein:

the step of generating a first indication includes steps of sensing said first indication with a first switch mounted adjacent to said rotating member in relation to said first angle and causing said first light source to be connected to a source of energy when said first indication is sensed; and the step of generating said second indication includes steps of sensing said second indication with a second switch mounted adjacent to said rotating member in relation to said second angle and causing said second light source to be connected to a source of energy when said second indication is sensed.

20. The method of claim 19, further including a step of:

issuing a magnetic field from a magnet disposed on the rotating member; and wherein:

said step of sensing said first indication includes sensing said magnetic field with said first switch when said magnet is at about said first angle; and said step of sensing said second indication includes sensing said magnetic field with said second switch when said magnet is at about said second angle.

21. The method of claim 19, wherein:

said step of sensing said first indication includes sensing when a cam on said rotating member is at about said first angle; and said step of sensing said second indication includes sensing when said cam is at about said second angle.

22. The method of claim 12, wherein:

the step of issuing said first indication includes steps of rapidly straining a first piezoelectric device when said rotating member is at about said first angle and issuing a first electrical signal in response to a change in said straining of said first piezoelectric device;

the step of issuing said first light signal includes issuing said first light signal in response to said first electrical signal;

the step of issuing said second indication includes steps of rapidly straining a second piezoelectric device when said rotating member is at about said second angle and issuing a second electrical signal in response to a change in said straining of said second piezoelectric device; and the step of issuing said second light signal includes issuing said second light signal in response to said second electrical signal.

* * * * *